June 18, 1968 M. SLAVIN 3,389,338

SIMPLIFIED BAND SWITCHING FOR FM-AM RECEIVER

Filed Nov. 24, 1964

MICHAEL SLAVIN
INVENTOR

BY Killman & Lamb
ATTORNEYS

United States Patent Office 3,389,338
Patented June 18, 1968

3,389,338

SIMPLIFIED BAND SWITCHING FOR FM-AM RECEIVER

Michael Slavin, Baltimore, Md., assignor to The Bendix Corporation, Baltimore, Md., a corporation of Delaware
Filed Nov. 24, 1964, Ser. No. 413,466
6 Claims. (Cl. 325—316)

ABSTRACT OF THE DISCLOSURE

A simplified band switch for an FM-AM receiver utilizing a double pole, double throw electrical switch having both poles grounded. In the FM mode, the switch is positioned to ground the input to the AM antenna tuning circuit and the input to the AM-IF transformer. In the AM mode the switch is positioned to increase the forward bias on the FM mixer transistor so that the transistor saturates and also to remove a back bias normally applied to the AM detector.

Figures 1, 2:
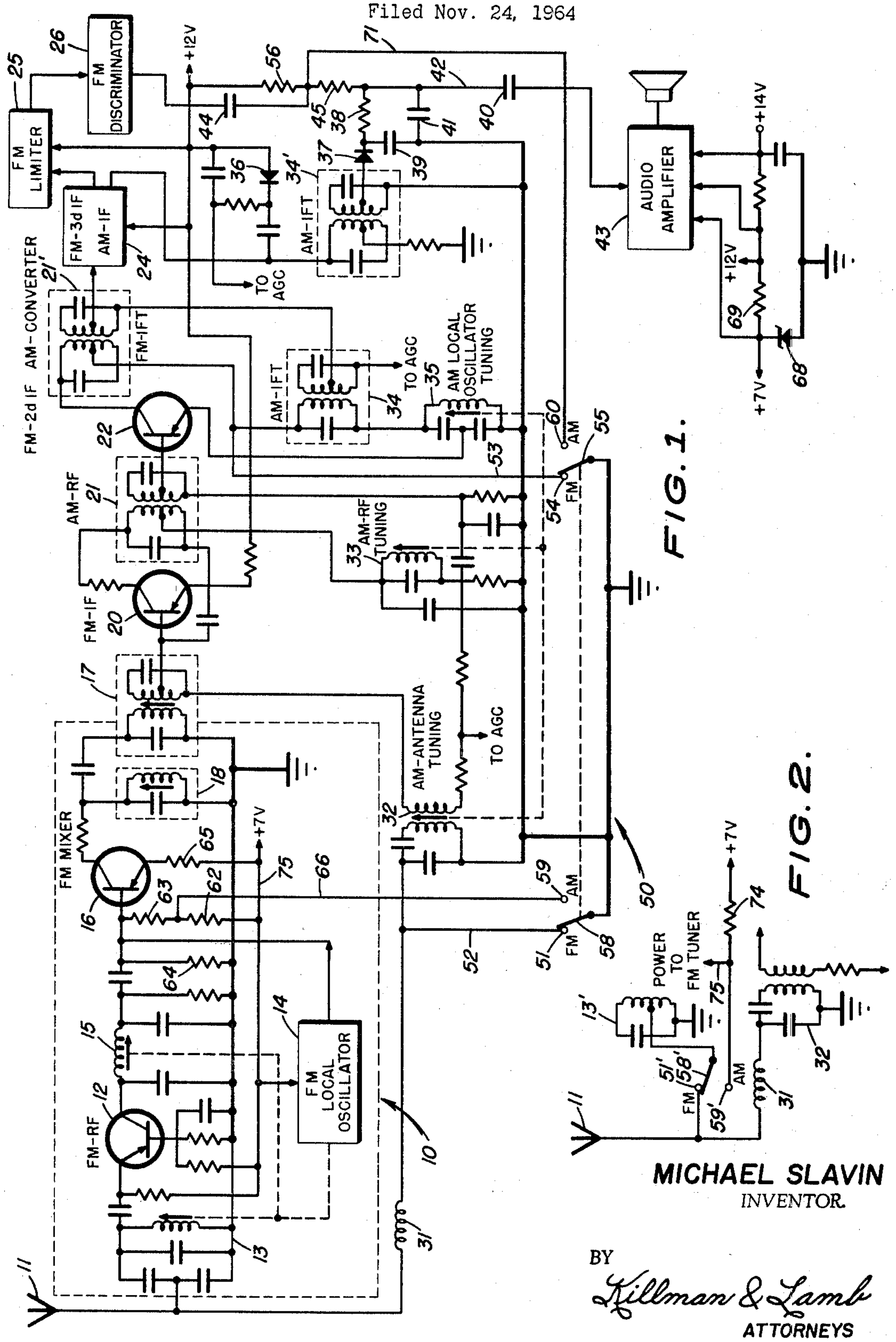

The present invention relates to automobile radio receivers. More particularly it relates to improved receiver band switching arrangements for selecting operation on either the AM or FM entertainment broadcast bands.

The conditions under which an automobile radio must operate are severe as compared to the conditions for home reception. Careful design is required to prevent shock and vibration from causing microphonic instabilities. High gain and wide dynamic range of the automatic gain control are necessary to cope with the large fluctuations in signal strength occurring during travel. The wide separation between the frequencies of the AM and FM bands, differences in propagation characteristics and differences in methods of modulation of the two bands set the problems of constructing an AM-FM receiver completely apart from those of constructing an all-wave AM receiver. The simple substitution of circuits tuned to the FM band for those of the AM band is unsatisfactory because a large number of switch contacts are required and the switch contacts must be located so that connecting leads will be short. Further, undesired couplings and microphonics are likely to occur in switches handling high frequency currents. Preferably the desired receiver function would be selected by switching only direct current at as few points as possible.

The most direct way of providing reception on either the AM or FM band is to use separate receivers. The audio amplifiers in such case, though, are wastefully duplicated. More economically, a common audio amplifier and separate tuners, each complete through the detector or discriminator, could be used. Function selection in either case is accomplished simply by applying power to the desired receiver or tuner. Both schemes involve the added expense of providing duplicate stages of RF and IF amplification.

The present invention achieves band changing in a re-receiver having dual purpose stages very nearly as simply as either of the above mentioned methods. The fact that certain stages, notably the IF, operate in common for both AM and FM reception while other stages operate in different modes for AM reception than for FM reception requires means for insuring that signals in the undesired band or noise from unused stages is prevented from interferring with the desired signal.

It is an object of the invention to provide a radio receiver having a simplified, reliable switching arrangement for selecting the function of AM or FM reception.

It is an additional object to provide a function switching arrangement which eliminates the necessity for switching high frequency currents, thereby permitting the switch to be conveniently located.

Another object of the invention is to provide an AM-FM receiver having a minimum number of switched circuits for function selection, thereby reducing the cost and improving the performance and reliability of the receiver.

Briefly, the invention comprises an AM-FM receiver in which function changing is accomplished by a double-pole, double-throw switch connected to perform the following operations:

For FM reception;
- (a) transfer the antenna to the FM-RF amplifier
- (b) disable the AM converter
- (c) disable the AM detector and
- (d) enable the FM discriminator.

For AM reception;
- (a) transfer the antenna to the AM-RF amplifier
- (b) disable the FM mixer
- (c) enable the AM detector and
- (d) disable the FM discriminator.

FIG. 1 of the drawings is a simplified schematic of the invention, and FIG. 2 is a modification of FIG. 1.

Referring to FIG. 1, a superheterodyne receiver capable of receiving either the AM or FM entertainment broadcast bands is illustrated. Only those portions of the circuit in which the operation is altered by the function selection switch are shown in detail. The remainder of the circuit appears in block form.

An FM tuner 10 which includes an FM radio frequency amplifier 12, local oscillator 14, and mixer 16 is operative only during FM reception. Incoming signals from an antenna 11 are selected by an antenna tuning circuit 13, amplified in the amplifier 12 which is tuned by the circuit 15, and applied to the mixer 16. The local oscillator 14 is tuned by the circuit 15 and applied to the mixer 16. The local oscillator 14 is tuned to a frequency offset from the frequency of the selected signal an amount equal to the intermediate frequency. The local oscillator output is injected into the mixer 16 which generates the difference frequency between that of the local oscillator output and the selected signal. The difference frequency signal, conventionally at 10.7 mcs., is selected for further amplification by an intermediate frequency transformer 17 tuned to that frequency. The IF selectivity of the mixer 16 may be improved by including a third tuned circuit 18, loosely coupled with those of transformer 17 and tuned to the same frequency. Thereafter the FM-IF signals are amplified in stages 20, 22 and 24, each of which includes tuned IF transformers 21 and 21', limited in stage 25 and finally applied to a discriminator stage 26 for recovery of the audio signal.

As thus far described, the receiver follows established design practices for FM reception. As an AM receiver, circuits tuned to the AM frequency band are connected in series with circuits tuned to the intermediate frequency used for FM reception. An amplifying stage can thus be tuned to respond to two widely separated frequency bands, with signals in the high frequency band passing unimpeded through the low frequency tuned circuit and signals in the low frequency band passing unimpeded through the high frequency tuned circuit. A single stage can readily serve then as an FM-IF implifier at a frequency of 10.7 mcs. or as an AM-IF amplifier, the latter two frequencies being about 1500 kcs. and 262 kcs. respectively.

AM signals from the antenna 11 are coupled through a choke 31, presenting a relatively high impedance to signals in the FM band and low impedance to AM signals, to an antenna tuning circuit 32. AM signals selected by circuit 32 are coupled through the secondary of FM-IF transformer 17 to the input of amplifying stage 20. A tuned load circuit 33, connected in series with the primary of the FM-IF transformer in the output of stage 20 selects signals for coupling to the following stage 22. Circuits 32 and 33 are simultaneously tuned to a signal frequency in the AM band. Hence for AM reception, stage 20 serves as an RF amplifier. The output circuit of stage 22 includes an FM-IF transformer 21', an AM-IF transformer 34 and an oscillator tank circuit 35 tuned to a frequency offset from the frequency of circuits 32 and 33 an amount equal to the AM intermediate frequency. For AM reception stage 22 serves as a converter in which signals selected by circuit 33 are mixed with self-generated oscillations of frequency determined by circuit 35 to produce the AM-IF signals in transformer 34.

Signals at the AM intermediate frequency are coupled from the secondary of transformer 34 through the secondary of FM-IF transformer 21 to the input of stage 24. Stage 24 includes in its output an FM-IF transformer similar to transformer 21' with the primary connected in series with an AM-IF transformer 34'. Only the AM-IF transformer is shown in detail. The lower gain required for AM reception makes it possible to detect the AM-IF signals at the output of stage 24, while the FM-IF signals must be further processed in stages 25 and 26 for satisfactory demodulation.

A diode 36 coupled to the primary of transformer 34' provides AGC voltage for controlling the gain of preceding stages in the usual manner for both AM and FM reception. A diode 37 connected to the secondary of transformer 34', together with load resistor 38 and capacitors 39 and 41, detects the AM signals for recovery of the audio. The audio signal appears on lead 42, whence it is coupled to an audio amplifier 43 for power amplification and conversion to sound. The audio output of discriminator 26 also appears on lead 42, arriving by way of a coupling capacitor 44 and resistor 45. The values of resistor 45 and capacitor 41 are chosen to provide standard de-emphasis for FM audio signals.

The receiver will be recognized as incorporating well-known features of separate AM and FM receivers. The tuned circuits for both bands are permanently connected to the amplifying elements without the band changing switch usually employed. For satisfactory operation in a selected band, the tendency of the receiver to function in the alternate band or to respond to interfering signals in the alternate band must be suppressed.

In accordance with the invention, a double-pole, double-throw switch 50 is connected to ground selected points in the AM circuit to insure freedom from AM interference during FM operation. In the alternate position, the AM circuits are restored to operation and the FM circuits are disabled by grounding points in the FM circuit. The switch points do not appear in high impedance circuit branches, hence formerly troublesome switch factors, such as capacity, RF resistance and the like, have no effect on the switch performance.

Switch 50 is shown in position for FM operation. Both poles 55 and 58 are grounded. Switch contact 51 is connected through lead 52 to the high side of the AM antenna tuning circuit 32. Consequently for FM, AM signals from the antenna 11 are short-circuited, while the high impedance presented by choke 31 to FM signals couples those higher frequency signals into FM tuning circuit 13. AM signals cannot enter stage 20 by way of stages 12 and 16 because AM signal frequencies are well below the pass band of tuned circuits 13, 15, 17 and 18. Stage 22 is prevented from self-oscillation at the AM local oscillator frequency by short-circuiting transformer 34 and tank circuit 35 with lead 53 connected through switch contact 54 to the grounded switch pole 55. Grounding leads 52 and 53 effectively prevents the operation of the receiver at any AM signal or IF frequency. The audio signal from discriminator 26 at the junction of resistors 38 and 45, however, is subject to distortion by the AM detector diode 37. To prevent such distortion, diode 37 is reverse biased by a positive potential applied through a resistor 56 to the FM de-emphasis resistor 45. This positive bias is isolated by the capacitors 40 and 44 so that it has no effect on the discriminator 26 or audio amplifier 43.

For AM operation, poles 55 and 58 engage the alternate contacts 59 and 60. In this position the short circuit is removed from the antenna tuning circuit 32, allowing the selected AM signal to be coupled into stage 20. The FM tuner 10 is disabled by altering the bias applied to mixer stage 16. For normal operation, the emitter of stage 16, suitably a PNP type transistor, is biased by resistors 62 and 63 connected in series between a +7 volts supply and the transistor base. The transistor base is returned to ground through a resistor 64. The values of resistors 62, 63 and 64 depend upon the transistor characteristics and operating point. In one example, resistor 62 is 5.6KΩ, resistor 63 is 1KΩ and resistor 64 is 12KΩ. Neglecting emitter current, a voltage is established at the transistor base of about 4.2 volts. The emitter is supplied at the higher potential of 7 volts through resistor 65. When switch pole 58 grounds contact 59, the junction of resistors 62 and 63 is grounded. This action causes the potential at the base of transistor 16 to be reduced, thus substantially increasing the forward bias across the emitter-base junction of transistor 16 and causing the transistor to be saturated. A saturated transistor is incapable of amplification; hence, increasing the bias in the manner shown is equivalent to the removal of operating bias from the transistor. The latter operation could be accomplished by connecting lead 66 directly to the +7 v. power source. The +7 v. power source, which is constituted by a Zener diode 68 and dropping resistor 69, also supplies bias to the audio amplifier 43. Saturating transistor 16 is more economical than short-circuiting its bias source since a separate regulated bias source need not then be provided for the audio amplifier.

With the FM mixer stage 16 thus disabled, FM signals from the antenna cannot pass through to stage 20. The AM signals in stage 20, now functioning as an RF amplifier are selected by tuned load circuit 33 for coupling to stage 22. The short circuit across the AM-IF transformer 34 and local oscillator tank 35 is removed since lead 53 is no longer connected to ground, hence stage 22 serves as a converter to transpose the selected AM signal to the intermediate frequency of the receiver. The intermediate frequency signal output of converter 22 appears after further amplification in stage 24 in the secondary of transformer 34'.

Detector diode 37, which was back biased for FM operation, is restored to operation by grounding resistor 56 through lead 71 and switch contact 60. This removes all direct bias from diode 37 and grounds the output of discriminator 26. The audio from the detected AM signals appears principally across resistor 45, whence it is coupled from lead 42 to the audio amplifier 43. The receiver thus functions in the AM mode without interference from FM signals, with all necessary circuit alterations having been effected by means of a double-pole, double-throw switch.

In the modification of FIG. 2, the switch arm 58' is connected to a tap on the coil of the FM antenna tuning circuit 13'. Contact 51' is connected to the antenna 11 ahead of choke 31. A dropping resistor 74 is inserted in the lead connecting the +7 v. bus 75 of the FM tuner 10 (FIG. 1) to the +7 v. power supply. Contact 59 is connected to a point on bus 75.

For FM operation, switch arm 58' engages contact 51' applying FM signals from the antenna 11 to the antenna tuning circuit 13'. The tuning circuit 13' differs from circuit 13 of FIG. 1 in the use of an inductive tap rather than a capacitive tap for impedance matching. The inductive impedance between switch arm 58' and ground is very low at AM signal frequencies, consequently the AM antenna tuning circuit 32 is effectively short-circuited.

For AM operation, switch arm 58′ engages contact 59′ and breaks the circuit with contact 51′, thus allowing the AM signals to pass to the antenna tuning circuit 32. The voltage on bus 75 is reduced to zero because of the short circuit through the coil of the FM antenna tuning circuit 13′, thereby disabling the FM tuner.

Other modifications will be apparent in the light of the above teachings. It is to be understood therefore that the invention is limited solely by the scope of the appended claims.

The invention claimed is:

1. A superheterodyne receiver selectively operable on the AM or FM bands, comprising
- an FM tuning portion for selecting and converting an FM signal to a first intermediate frequency;
- an AM tuning portion for selecting and converting an AM signal to a second intermediate frequency;
- amplifying means responsive to applied signals of either said first or second intermediate frequency,
- means for recovering audio from amplified first intermediate frequency signals,
- a detector for recovering audio from amplified second intermediate frequency signals,
- an audio amplifier,
- an input network for said audio amplifier, said network being capacitively coupled to said means for recovering audio from said first intermediate frequency signals, directly coupled to said detector and capacitively coupled to said amplifier,
- means applying a potential to said network for reverse biasing said detector, and
- a band selection switch including a first contact for removing the potential applied to said network thereby permitting audio to pass from said detector to said audio amplifier.

2. A receiver as claimed in claim 1 including a second contact for said switch operable simultaneously with said first contact for rendering said FM tuning portion inoperative.

3. A receiver as claimed in claim 2 with a third contact for said switch operable alternately with said first and second contacts for rendering said AM tuning portion inoperative.

4. A superheterodyne receiver selectively operable on the AM or FM bands, comprising
- an FM tuner for selecting an FM signal and including means for converting the frequency of the selected FM signal to a first intermediate frequency higher than the signal frequencies of the AM band;
- first amplifying means including circuits tuned to said first intermediate frequency for amplifying signals at said first intermediate frequency, and variably tuned circuits for selecting a signal from the AM band and converting the same to a second intermediate frequency;
- additional amplifying means including circuits tuned to said first intermediate frequency and circuits tuned to said second intermediate frequency for amplifying applied signals of either frequency;
- means for recovering audio from FM signals of said first intermediate frequency;
- a detector for recovering audio from AM signals at said second intermediate frequency;
- means applying a fixed bias to said detector to render the same normally inoperative;
- an audio amplifier including an input network to which audio recovered from FM and audio recovered from AM are both applied; and
- a switch for selecting the operating band of the receiver including a first pair of contacts for short-circuiting circuits of said first amplifying means tuned to frequencies lower than said first intermediate frequency thereby preventing response to signals in the AM band and an alternate pair of contacts, one of which is arranged to disable said FM tuner, the other of which is arranged to remove said detector bias, thereby permitting response to signals in the AM band.

5. A superheterodyne receiver selectively operable on the AM or the FM band, comprising
- a tuner for FM signals including transistor stages for amplifying a selected signal and converting the same to a first intermediate frequency higher than the frequency of signals in the AM band,
- a bias supply for said tuner;
- an antenna;
- means coupling said antenna to said tuner;
- transistor amplifying stages coupled in cascade by transformers turned to said first intermediate frequency, one stage of which includes resonant input and output circuits tunable to frequencies offset from the tuned frequency of said one stage and connected for local oscillation for converting the frequency of signals selected by the tunable circuits of said one stage to a second intermediate frequency;
- means coupling said antenna to a tunable input circuit of said one stage;
- an additional transistor amplifying stage including input and output transformers tuned to said first intermediate frequency and input and output transformers tuned to said second intermediate frequency for coupling and amplifying signals of either intermediate frequency from said stage following said one stage;
- a diode for detecting signals of said second intermediate frequency from said additional stage;
- means for recovering audio from signals of said first intermediate frequency from said additional stage;
- an audio amplifier;
- an input network for said audio amplifier to which audio signals from said detector and from said recovery means are applied;
- means applying a potential to said network sufficient to reverse bias said diode; and
- switching means for selecting the operating band of the receiver including a double-pole, double-throw switch, having a first pair of contacts engaged in one switch position and a second pair of contacts engaged in an alternate switch position,
- one contact of said first pair being connected to prevent coupling of signals from said antenna to the tunable input circuit of said one stage, the other contact of said first pair being connected to said offset resonant circuit of said following stage to prevent local oscillation, the first position of said switch thereby providing FM operation;
- one contact of said second pair being connected to said tuner bias supply for rendering said tuner inoperative; the other contact of said second pair being connected to remove said reverse bias from said diode, the alternate position of said switch thereby providing AM operation.

6. A receiver claimed in claim 5 wherein the poles of said switch are grounded, said one contact of said first pair is connected to said tunable input circuit of said one stage, the other contact of said first pair is connected to said offset resonant circuit; said one contact of said second pair is connected to said tuner bias supply; and said other contact of said second pair is connected to the point of application of said reverse bias potential to said network.

References Cited

UNITED STATES PATENTS 3,172,040 3/1965 Schultz ------------ 325—316

KATHLEEN H. CLAFFY, *Primary Examiner.*

R. LINN, *Assistant Examiner.*